United States Patent
Jiang et al.

(10) Patent No.: US 8,237,495 B2
(45) Date of Patent: Aug. 7, 2012

(54) HIGH EFFICIENCY AMPLIFIER WITH REDUCED ELECTROMAGNETIC INTERFERENCE

(75) Inventors: Xicheng Jiang, Irvine, CA (US); Jianlong Chen, Irvine, CA (US)

(73) Assignee: Broadcom Corporation, Irvine, CA (US)

( * ) Notice: Subject to any disclaimer, the term of this patent is extended or adjusted under 35 U.S.C. 154(b) by 42 days.

(21) Appl. No.: 12/803,869

(22) Filed: Jul. 7, 2010

(65) Prior Publication Data

US 2012/0008240 A1    Jan. 12, 2012

(51) Int. Cl.
     *H03F 3/38*      (2006.01)
     *H03F 3/04*      (2006.01)
(52) U.S. Cl. ......................... 330/10; 330/298
(58) Field of Classification Search .................... 330/10, 330/251, 207 A, 207 P, 298
See application file for complete search history.

(56) References Cited

U.S. PATENT DOCUMENTS

| | | | |
|---|---|---|---|
| 6,294,954 B1 * | 9/2001 | Melanson | 330/10 |
| 7,449,913 B1 | 11/2008 | Hung | |
| 2008/0094041 A1 | 4/2008 | Gerber | |
| 2008/0284508 A1 | 11/2008 | Walker | |

* cited by examiner

*Primary Examiner* — Robert Pascal
*Assistant Examiner* — Khiem Nguyen
(74) *Attorney, Agent, or Firm* — Farjami & Farjami LLP

(57) ABSTRACT

Disclosed is a high efficiency amplifier operable to substantially reduce electromagnetic interference (EMI). The high efficiency amplifier comprises an output stage to provide a high powered signal to a load. The high efficiency amplifier further comprises an overlap protection circuit to produce a timing non-overlap in a control signal for the output stage, and an edge control circuit to reduce a transient portion of the high powered signal to substantially reduce the EMI. The overlap protection circuit and the edge control circuit may be implemented with resistive source degeneration. Also disclosed is a related method. In one embodiment, the high efficiency amplifier and the related method may be incorporated into a cellular telephone or a mobile audio device.

20 Claims, 6 Drawing Sheets

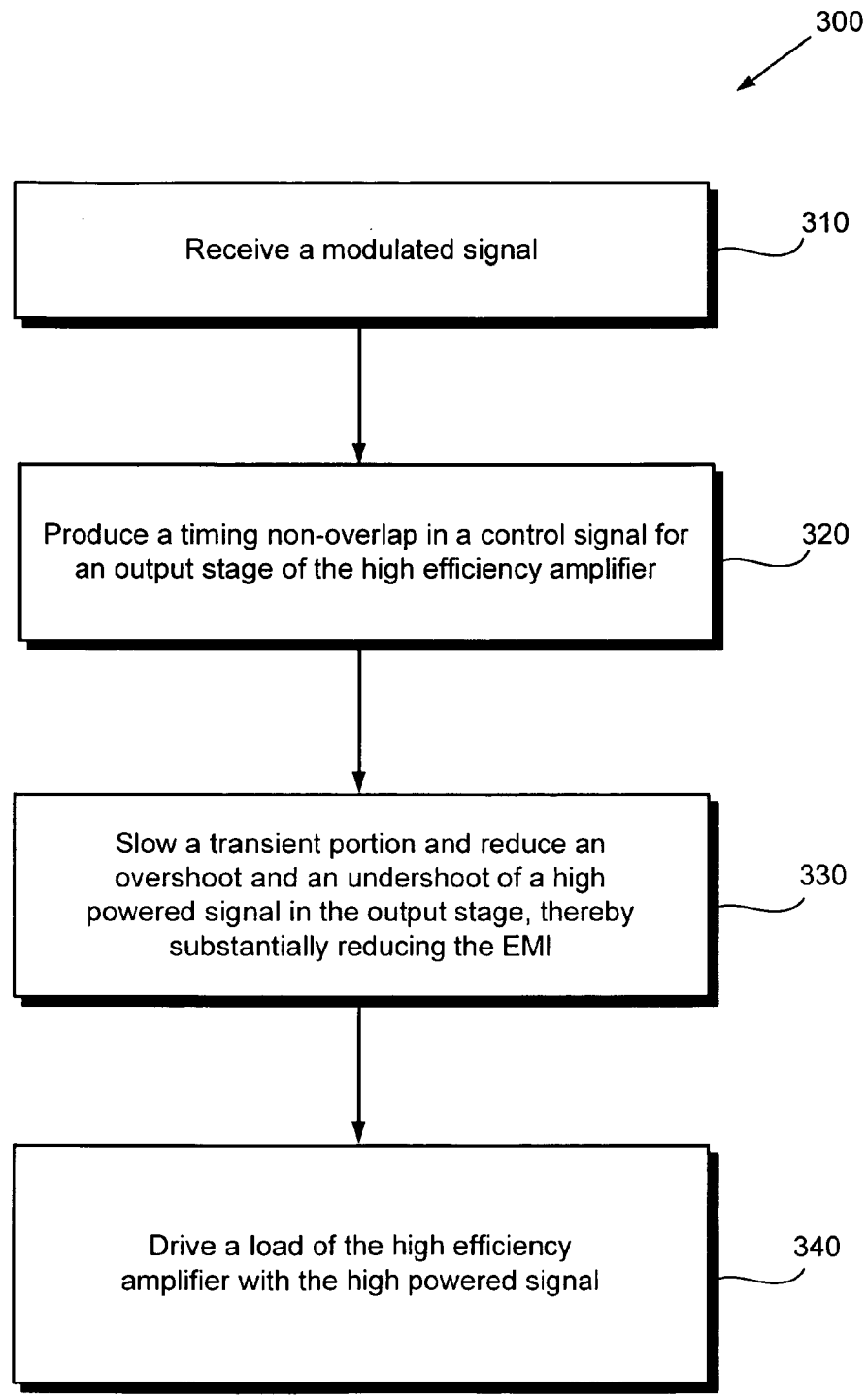

HIGH EFFICIENCY AMPLIFIER WITH REDUCED ELECTROMAGNETIC INTERFERENCE

BACKGROUND OF THE INVENTION

1. Field of the Invention

The present invention is generally in the field of electrical circuits and systems. More specifically, the present invention is in the field of amplifier circuits.

2. Background Art

Switched power amplifiers such as Class-D amplifiers potentially provide efficient amplification for mobile devices. A conventional switched power amplifier, however, presents problems when used in many mobile devices like cellular telephones and mobile audio devices. Unfortunately, the driver circuit of a conventional switched power amplifier emits an electromagnetic interference (EMI) that can interfere with other mobile devices. EMI may cause a mobile device to fail Federal Communications Commission (FCC) standards, for example. Moreover, rapid output transitions may result in large transient variations as well as overshoots and undershoots in a high powered signal that drives output stage transistors in a conventional switched power amplifier. These transient variations can damage devices and severely degrade amplifier efficiency.

Neither conventional passive filters nor conventional EMI reduction circuitry has successfully addressed these shortcomings. For example, although an integrated passive filter partially limits transient variations in the high powered signal, this type of filter does not limit the EMI due to the driver circuit. Conversely, conventional EMI reduction circuitry reduces EMI but overlooks limiting the transient variations within the high powered signal. It is desirable to coherently reduce both the EMI and the large transient variations and the overshoots and undershoots of the high powered signal of a conventional switched power amplifier without significant switching losses or crowbar currents.

Accordingly, there is a need to overcome the drawbacks and deficiencies in the art by providing a high efficiency amplifier with reduced EMI, and which is suitable for implementation in a mobile communications device.

SUMMARY OF THE INVENTION

The present application is directed to a high efficiency amplifier with reduced electromagnetic interference, substantially as shown in and/or described in connection with at least one of the figures, as set forth more completely in the claims.

BRIEF DESCRIPTION OF THE DRAWINGS

FIG. 3 is a flowchart presenting a method for substantially reducing EMI in a high efficiency amplifier, according to one embodiment of the present invention.

DETAILED DESCRIPTION OF THE INVENTION

Figure 1:
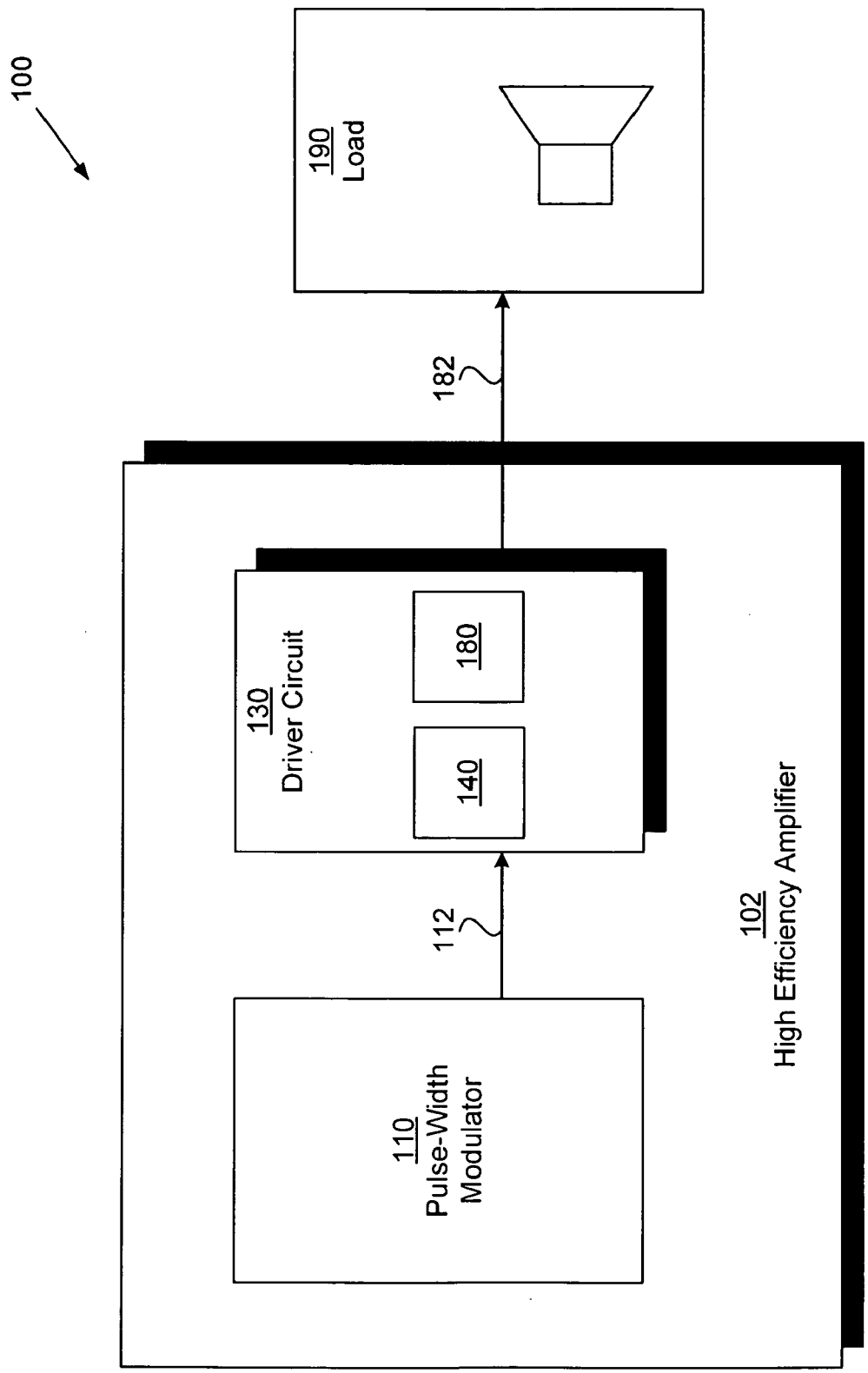
FIG. 1 shows a conceptual block diagram of an exemplary switched amplifier implemented in a mobile device, according to one embodiment of the present invention.

The present invention is directed to a high efficiency amplifier with reduced electromagnetic interference (EMI). Although the invention is described with respect to specific embodiments, the principles of the invention, as defined by the claims appended herein, can obviously be applied beyond the specifically described embodiments of the invention described herein. Moreover, in the description of the present invention, certain details have been left out in order to not obscure the inventive aspects of the invention. The details left out are within the knowledge of a person of ordinary skill in the art.

The drawings in the present application and their accompanying detailed description are directed to merely exemplary embodiments of the invention. To maintain brevity, other embodiments of the invention, which use the principles of the present invention are not specifically described in the present application and are not specifically illustrated by the present drawings. It should be borne in mind that, unless noted otherwise, like or corresponding elements among the figures are indicated by like or corresponding reference numerals. Moreover, the drawings and illustrations in the present application are generally not to scale, and are not intended to correspond to actual relative dimensions.

A switched power amplifier, such as a class-D amplifier, typically includes a modulator, a driver, and a load. The modulator provides a modulated pulse signal to the driver, which can use the switching function of transistors to drive the load with a high powered signal. Though efficient, conventional switched power amplifier can present problems when used in many mobile devices, including cellular phones and mobile audio devices. Unfortunately, EMI produced by the driver circuit of a conventional switched power amplifier may interfere with wireless communications and may undermine compliance with Federal Communications Commission (FCC) operating requirements. Moreover, conventional driver circuits can exhibit large transient current variations that may damage sensitive electronic devices, consume large amounts of dynamic power, and reduce amplifier efficiency. Conventional passive filters and conventional EMI reduction circuitry have not coherently addressed these problems.

FIG. 1 shows a block diagram of mobile device environment 100, which includes high efficiency amplifier 102 according to one embodiment of the present invention. As shown in FIG. 1, high efficiency amplifier 102 provides high powered signal 182 to load 190, which may comprise an audio speaker, mobile device headset, or multi-function device, for example. High efficiency amplifier 102 may comprise pulse-width modulator/pulse-density modulator 110 and driver circuit 130. Driver circuit 130 may comprise pre-driver stage 140 and output stage 180. High efficiency amplifier 102 may be integrated into a semiconductor die and/or be implemented in a cellular telephone or mobile audio device. It is noted that although FIG. 1 represents high powered signal 182 as a single-ended output from high efficiency amplifier 102, more generally, high efficiency amplifier 102 can be adapted to provide differential outputs to a load such as load 190.

Figure 2A:
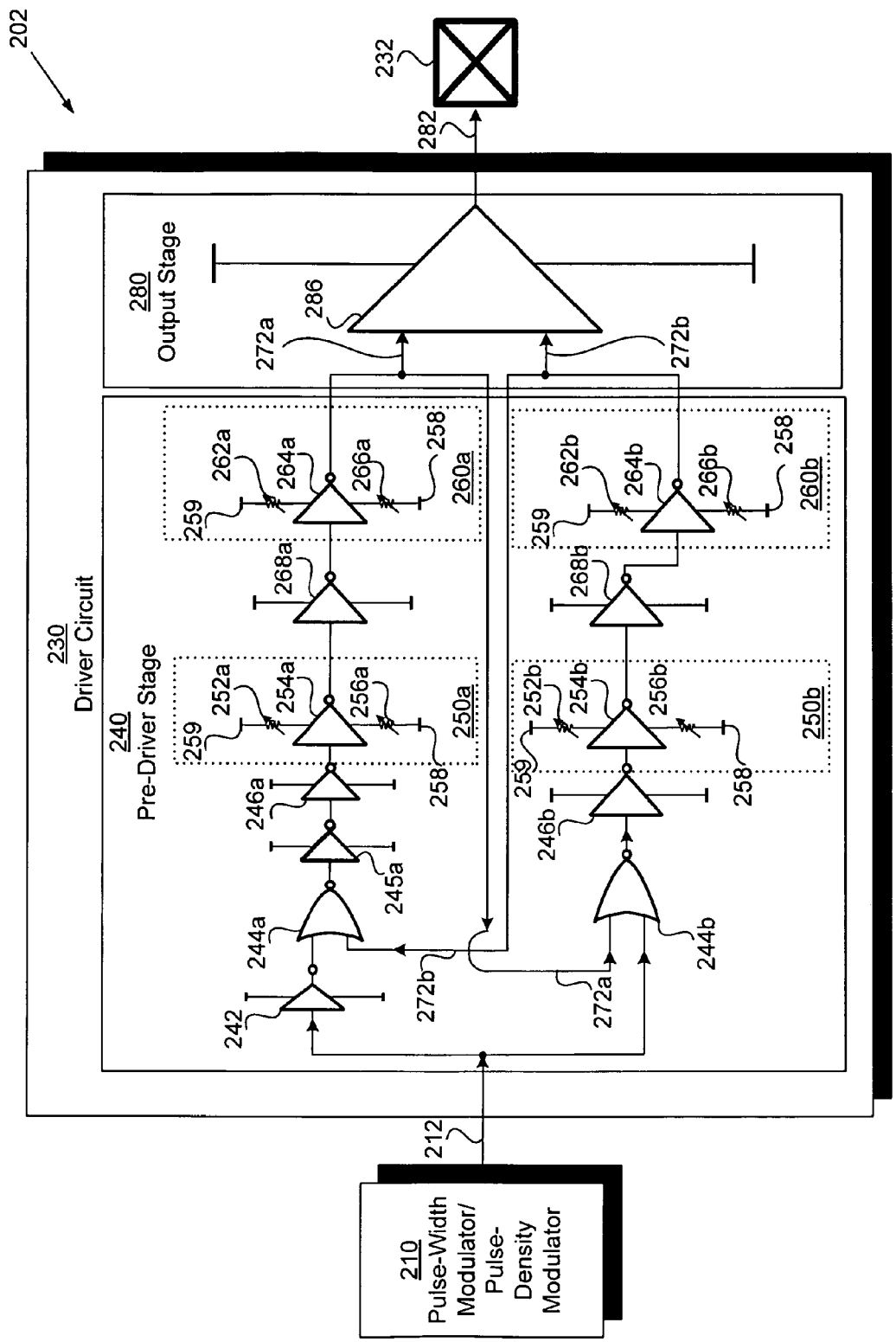
FIG. 2A is a block diagram showing a high efficiency amplifier configured to have reduced electromagnetic interference (EMI), according to one embodiment of the present invention.

FIG. 2A depicts high efficiency amplifier 202, which further describes the exemplary features provided by high efficiency amplifier 102 in FIG. 1. High efficiency amplifier 202, in FIG. 2A, comprises pulse-width modulator/pulse-density modulator 210 and driver circuit 230 including pre-driver stage 240 and output stage 280. Pulse-width modulator/pulse-density modulator 210 of high efficiency amplifier 202 may provide modulated signal 212 to driver circuit 230. Output stage 280 may comprise switching circuit 286 having one or more power transistors arranged in an H-Bridge configuration or other configuration known in the art to provide switching amplification. First control signal 272a and second control signal 272b control output stage 280. Output stage 280 may provide high powered signal 282 at output terminal 232.

Comparing FIGS. 1 and 2, it may be seen that pre-driver stage 240 and output stage 280, in FIG. 2A, can correspond to respective portions of pre-driver stage 140 and output stage 180, in FIG. 1. Moreover, output terminal 232 may correspond to one of a pair of differential output terminals. Thus, in one embodiment, high efficiency amplifier 202 may include two iterations of driver circuit 230, each receiving a modulated input from pulse-width modulator/pulse-density modulator 210, and each providing a respective high powered output signal at respective differential output terminals corresponding to output terminal 232.

According to the embodiment shown in FIG. 2A, pre-driver stage 240 drives output stage 280. As shown in FIG. 2A, pre-driver stage 240 may comprise first overlap protection circuit 250a, second overlap protection circuit 250b, first edge control circuit 260a, and second edge control circuit 260b. In addition to these components, pre-driver stage 240 may also comprise NOR gates 244a and 244b, and inverters 242, 245a, 246a, 268a, 246b, and 268b.

Focusing in on overlap protection circuits 250a and 250b, overlap protection circuits 250a and 250b may include an inverter comprised of at least two transistors, each of the at least two transistors comprising a variable source degeneration, such as a resistive source degeneration, that is adjustable to produce a timing non-overlap. For instance, first overlap protection circuit 250a may comprise inverter 254a, which may include at least two transistors. Inverter 254a may be coupled to supply voltage 259 through first source degeneration resistor 252a, and to supply voltage 258 through second source degeneration resistor 256a. Similarly, second overlap protection circuit 250b may comprise inverter 254b, which may include at least two transistors. Inverter 254b may be coupled to supply voltage 259 through source degeneration resistor 252b, and to supply voltage 258 through source degeneration resistor 256b.

In this embodiment, edge protection circuits 260a and 260b may also include at least two transistors, each of the at least two transistors comprising a variable source degeneration, such as a resistive source degeneration, that is adjustable to slow the transient portion and to reduce the overshoot and the undershoot of the high powered signal. As shown in FIG. 2A, first edge protection circuit 260a may comprise inverter 264a, which may include at least two transistors. Inverter 264a may be coupled to supply voltage 259 through source degeneration resistor 262a, and may be coupled to supply voltage 258 through source degeneration resistor 266a. Second edge protection circuit 260b may further comprise inverter 264b, which includes at least two transistors, coupled to supply voltage 259 through source degeneration resistor 262b and to supply voltage 258 through source degeneration resistor 266b. It is noted that although FIG. 2A characterizes source degeneration as being provided resistively, more generally, source degeneration may be provided by variable degeneration impedances coupling the respective transistors to their respective supply voltages.

As further shown in FIG. 2A, according to the present embodiment, pre-driver stage 240 may include two control failsafe circuits. A first control failsafe circuit may comprise first NOR gate 244a with an output coupled to first overlap protection circuit 250a. Inputs to first NOR gate 244a may include modulated signal 212, after inversion by input inverter 242, for example, and second control signal 272b. The second control failsafe circuit may comprise second NOR gate 244b with an output coupled to second overlap protection circuit 250b. Inputs to second NOR gate 244b may include modulated signal 212 and first control signal 272a.

Additionally, inverters 242, 245a, 246a, 268a, 246b, and 268b may each connect components within pre-driver stage 240. Consequently, input inverter 242 may connect modulated signal 212 and first NOR gate 244a. Inverters 245a and 246a may connect first NOR gate 244a and first overlap protection circuit 250a. Similarly, inverter 246b may connect second NOR gate 244b and second overlap protection circuit 250b. Inverter 268a may connect first overlap protection circuit 250a and first edge control circuit 260a. Inverter 268b may likewise connect second overlap protection circuit 260b and second edge control circuit 260b.

Figure 2B:
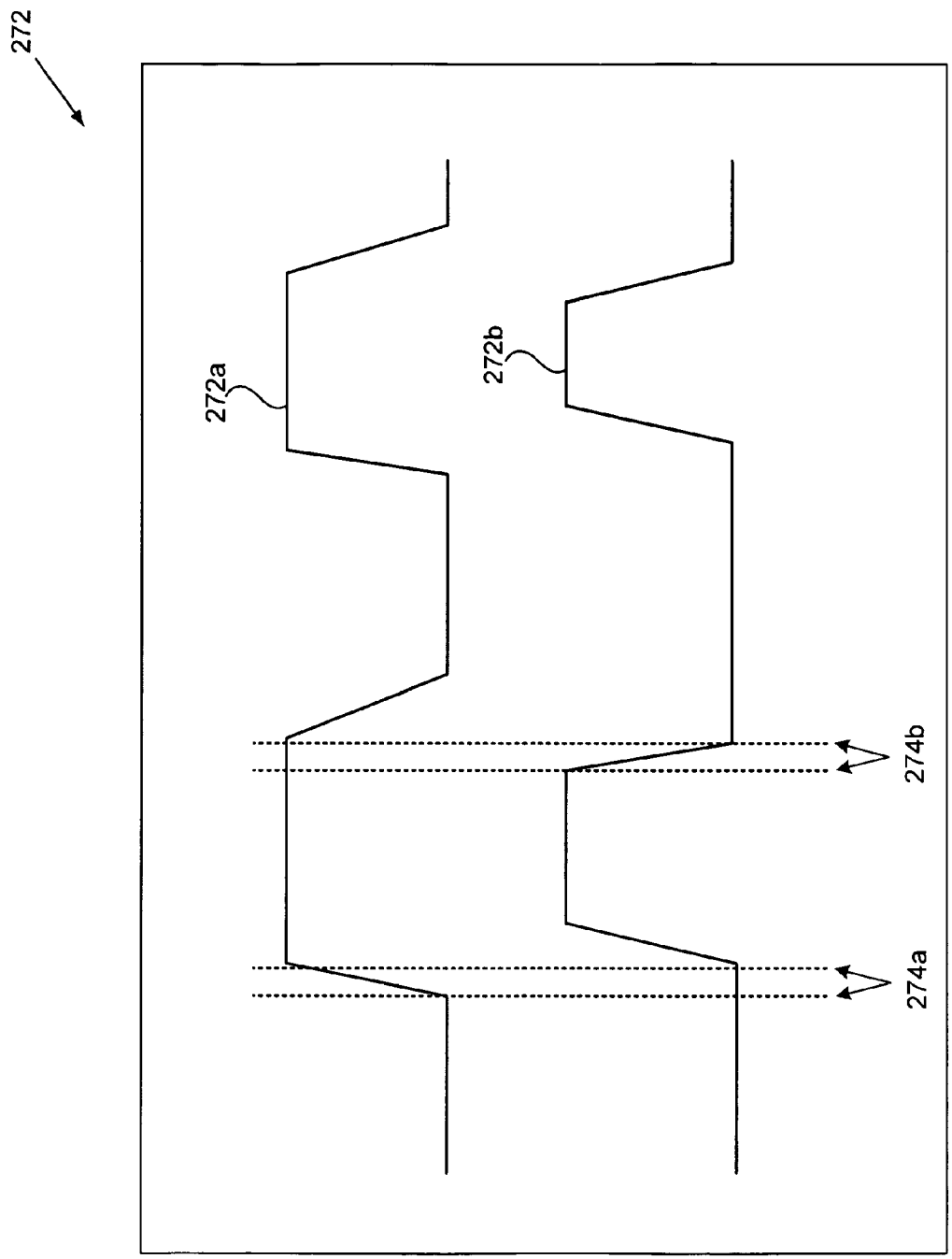
FIG. 2B is a graph depicting timing non-overlap in high efficiency amplifier according to one embodiment of the present invention.
Figure 4A:
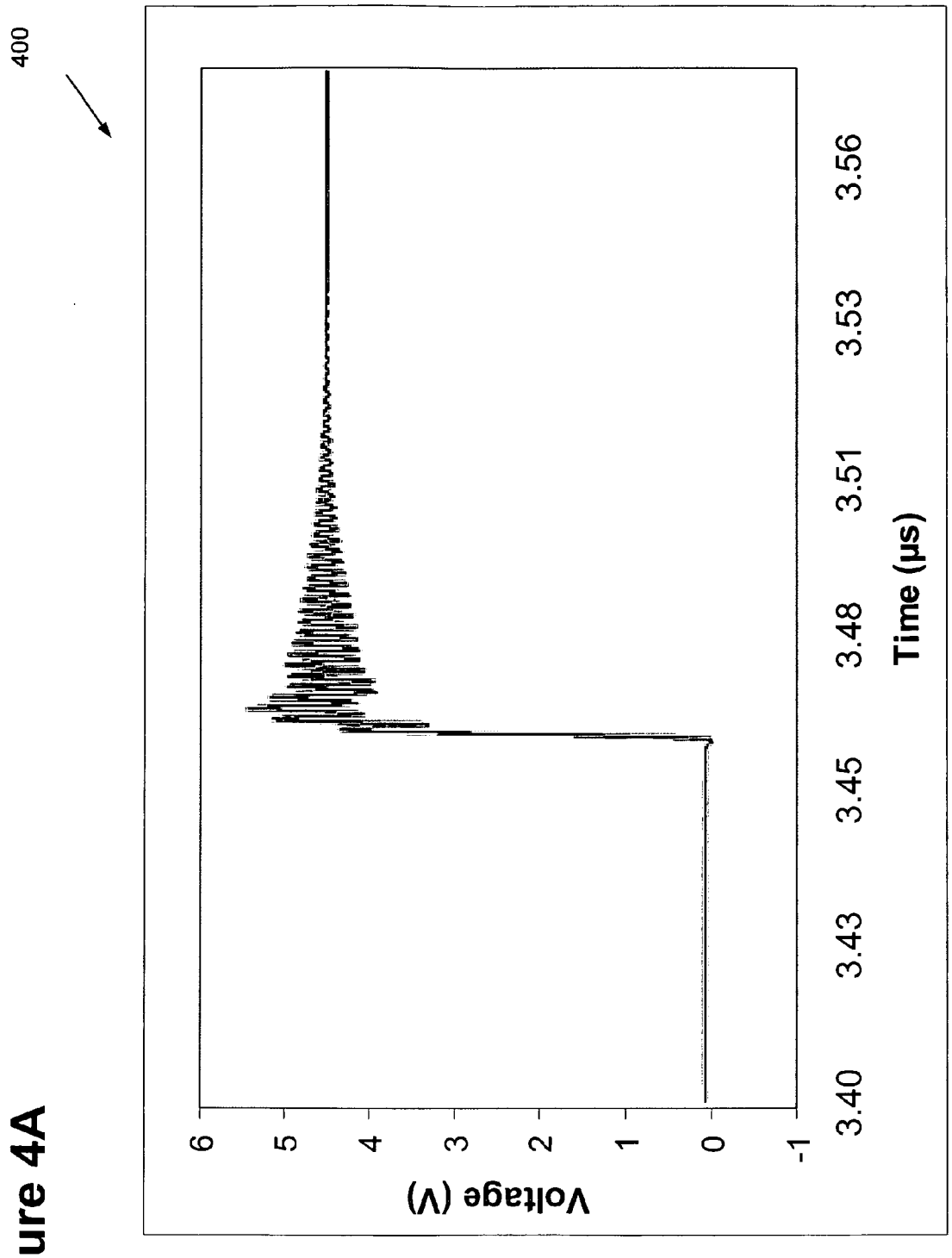
FIG. 4A is a graph showing a signal transition within a conventional amplifier circuit.
Figure 4B:
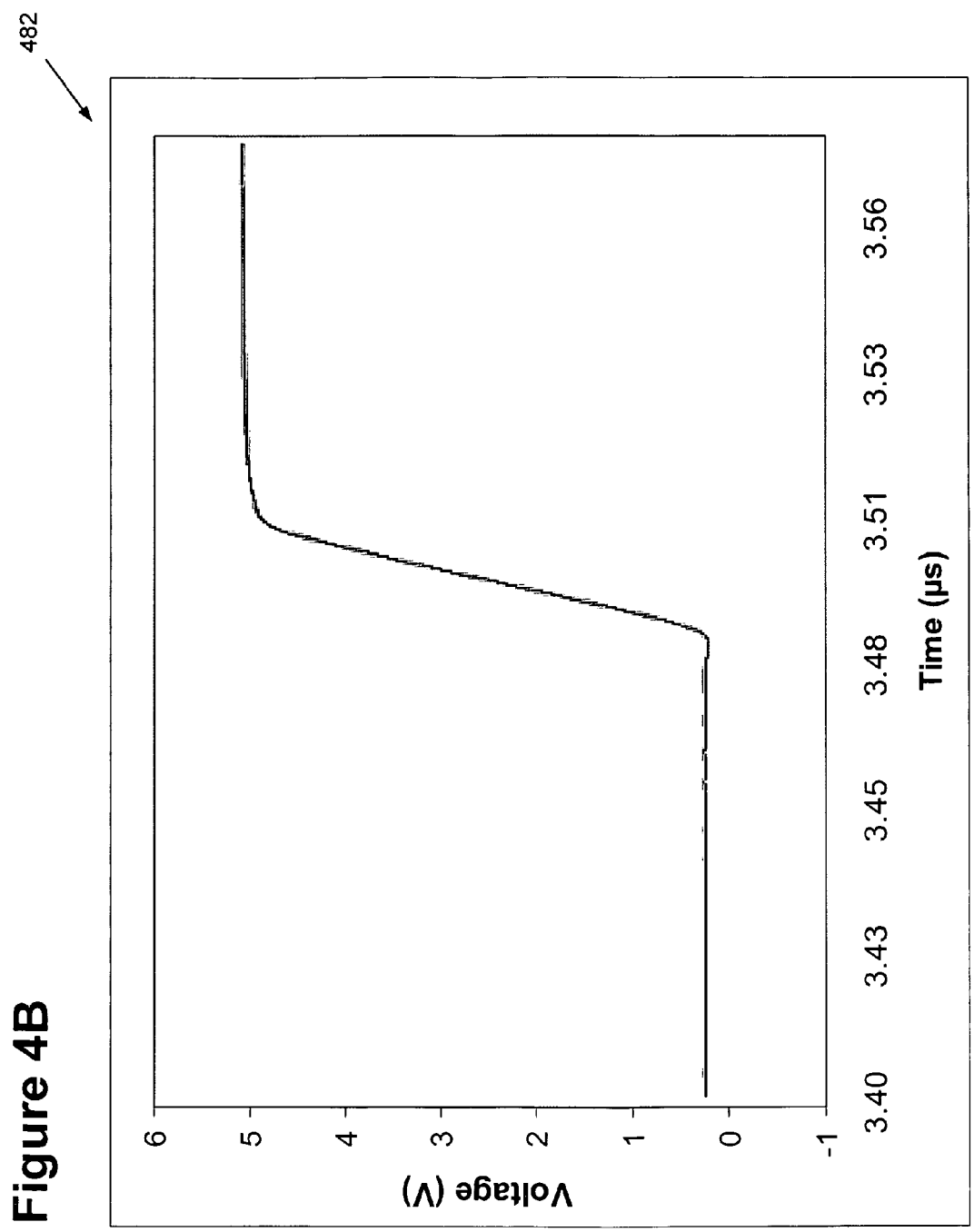
FIG. 4B is a graph showing signal transition within a high efficiency amplifier circuit according to an embodiment of the present invention.

The embodiments of the present invention exemplified in FIGS. 1 and 2A will be further described by reference to flowchart 300 in FIG. 3, and FIGS. 2B, 4A and 4B. Flowchart 300 in FIG. 3 describes the steps, according to one embodiment of the present invention, of a method for use by a high efficiency amplifier to substantially reduce EMI. FIG. 2B depicts timing non-overlap in within a high-efficiency amplifier according to one embodiment of the present invention, while FIGS. 4A and 4B show output signal transitions produced respectively by a conventionally switched amplifier and one operated according to the present inventive concepts.

Referring FIG. 3, it is noted that certain details and features that are apparent to a person of ordinary skill in the art have been left out of flowchart 300. For example, a step may comprise one or more substeps that are known in the art. While steps 310 through 340 indicated in flowchart 300 are sufficient to describe one embodiment of the present invention, other embodiments of the invention may utilize steps different from those shown in flowchart 300.

Step 310 of flowchart 300 comprises receiving a modulated signal. Referring to FIG. 2A, step 310 may be seen to correspond to receipt of modulated signal 212 by driver circuit 230 of high efficiency amplifier 202. As shown in FIG. 2A, driver circuit 230 may receive modulated signal 212 from pulse-width modulator/pulse-density modulator 210 of high efficiency amplifier 202.

Continuing with step 320 in FIG. 3, step 320 of flowchart 300 comprises producing a timing non-overlap in a control signal for an output stage of the high efficiency amplifier. With respect to first overlap protection circuit 250a in FIG. 2A, the variable impedances represented by first source degeneration resistor 252a and second source degeneration resistor 256a may be adjusted to introduce a timing non-overlap into first control signal 272a. Similarly, the variable impedances represented by source degeneration resistor 252b and source degeneration resistor 256b in second overlap protection circuit 250b may be adjusted to introduce a timing non-overlap into second control signal 272b.

As may be seen from FIG. 2A, the control failsafe circuits of high efficiency amplifier 202 may prevent first control signal 272a and second control signal 272b from concurrently providing an ON signal to output stage 280. For example, first NOR gate 244a may perform a logical NOR operation on second control signal 272b and modulated signal 212 after inversion by input inverter 242, thereby ensuring that first control signal 272a is not at a logical ON state at the same time as second control signal 272b. Similarly, second NOR gate 244b may perform a logical NOR operation on first control signal 272a and modulated signal 212, thereby ensuring that second control signal 272b is not at a logical ON state at the same time as first control signal 272a.

FIG. 2B shows a possible timing non-overlap in control signals 272. As shown, a rising edge of first control signal 272a may produce first timing non-overlap 274a with second control signal 272b. Moreover, a falling edge of second control signal 272b may produce second timing non-overlap 274b with first control signal 272a.

The timing non-overlaps in first control signal 272a and second control signal 272b can be adapted to substantially eliminate a crowbar current in output stage 280 of high efficiency amplifier 202. Consequently, these timing non-overlaps make high-side and low-side switches within output stage 280 less likely to simultaneously conduct when transitioning between HIGH and LOW states.

Moving to step 330 in FIG. 3, step 330 of flowchart 300 comprises slowing a transient portion and reducing an overshoot and an undershoot of a high powered signal in the output stage, thereby substantially reducing the EMI within the output stage. Returning to FIG. 2A, first edge control circuit 260a and second edge control circuit 260b may be adapted to slow a transient portion of high powered signal 282 and reduce an overshoot and an undershoot in high powered signal 282. Within first edge control circuit 260a, for example, the variable impedances represented by source degeneration resistor 262a and source degeneration resistor 266a may be adjusted to reduce a slew rate of first control signal 272a, ultimately reducing the slew rate of high powered signal 282. Similarly, within second edge control circuit 260b, the variable impedances represented by source degeneration resistor 262b and source degeneration resistor 266b may be adjusted to reduce the slew rate of the signal input into second edge control circuit 260b, thereby reducing the slew rate of high powered signal 282.

As noted above, FIGS. 4A and 4B illustrate exemplary reduced transient variations in a high powered signal produced according to the present inventive principles, such as high powered signal 282, in FIG. 2A. Referring first to FIG. 4A, FIG. 4A is a graph showing conventional high powered signal 400 over a time scale of between approximately 3.40 microseconds (μs) and approximately 3.56 μs. As shown in FIG. 4A, conventional high powered signal 400 has a rise time of approximately 1 nanosecond (ns). Though this rise time is rapid, conventional high powered signal 400 suffers from disadvantageous transient variations produced by the rapid signal transition. For example, conventional high powered signal 400 repeatedly undershoots and overshoots a desired output voltage in an oscillatory fashion before stabilizing at a steady-state value.

Turning to FIG. 4B, FIG. 4B is a graph showing high powered signal 482 over a time scale of approximately 3.40 μs and 3.56 μs that advantageously avoids substantial overshoot and undershoot, in accordance with an embodiment of the present invention. As shown in FIG. 4B, the rise time of high powered signal 482 has been slewed by a factor of approximately ten compared to the conventional rise time represented in FIG. 4A, to approximately 10 ns. Although high powered signal 482 has a slower rise time than conventional high powered signal 400 in FIG. 4A, high powered signal 482 lacks the transient variations of its conventional counterpart. More specifically, high powered signal 482 attains a steady state value without the transient variations of conventional high powered signal 400, or at least with substantial reductions in those transient variations. These slow rising and limited transient variations produced by embodiments of the present invention protect output stage devices, substantially reduce EMI, and ensure limited dynamic power consumption.

Continuing now to step 340 in FIG. 3, step 340 of flowchart 300 comprises driving a load of the high efficiency amplifier with the high powered signal. Referring again to FIG. 2A, FIG. 2A shows that high powered signal 282 may be output from high efficiency amplifier 202 to output terminal 232. As explained above, in some embodiments an high efficiency amplifier exemplifying the present inventive concepts can be adapted to provide a single-ended output, while in other embodiments, differential outputs may be provided to the load.

From the above description, it is apparent that embodiments of the present invention describe a novel circuit to efficiently drive a switched power amplifier so as to produce substantial reduced EMI when compared with conventional implementations. Exemplary driver circuits included in disclosed embodiments of the present invention are configured to provide efficient amplification while reducing or substantially eliminating EMI interference resulting from power switching transitions, and is characterized by reduced transient variations and limited crowbar currents. Embodiments of the present invention therefore coherently address problems with EMI and transient variations without the cost or other shortcomings of conventional switched driver circuits.

From the above description of the invention, it is manifest that various techniques can be used for implementing the concepts of the present invention without departing from its scope. Moreover, while the invention has been described with specific reference to certain embodiments, a person of ordinary skill in the art would recognize that changes could be made in form and detail without departing from the spirit and the scope of the invention. The described embodiments are to be considered in all respects as illustrative and not restrictive. It should also be understood that the invention is not limited to the particular embodiments described herein, but is capable of many rearrangements, modifications, and substitutions without departing from the scope of the invention.

The invention claimed is:

1. A high efficiency amplifier to substantially reduce an electromagnetic interference (EMI), said high efficiency amplifier comprising:
   an output stage to provide a high powered signal to a load;
   a first overlap protection circuit to produce a timing non-overlap in a first control signal for said output stage, said first overlap protection circuit comprising a variable degeneration impedance;
   a first edge control circuit to slow a transient portion of said high powered signal and to reduce an overshoot and an undershoot in said high powered signal, thereby substantially reducing said EMI.

2. The high efficiency amplifier of claim 1, wherein said timing non-overlap produced by said first overlap protection circuit is adjusted to substantially eliminate a crowbar current in said output stage.

3. The high efficiency amplifier of claim 1, wherein said first overlap protection circuit comprises at least two variable source degenerations adjustable to produce said timing non-overlap.

4. The high efficiency amplifier of claim 3, wherein said at least two variable source degenerations comprise resistive source degenerations.

5. The high efficiency amplifier of claim 1, wherein said first overlap protection circuit comprises an inverter, said inverter coupled to a first supply voltage through a first variable impedance, said inverter coupled to a second supply voltage through a second variable impedance.

6. The high efficiency amplifier of claim 5, wherein said first variable impedance and said second variable impedance are adjustable to produce said timing non-overlap.

7. The high efficiency amplifier of claim 1, wherein said first edge control circuit comprises at least two variable source degenerations adjustable to slow said transient portion and to reduce said overshoot and said undershoot of said high powered signal.

8. The high efficiency amplifier of claim 7, wherein said at least two variable source degenerations comprise resistive source degenerations.

9. The high efficiency amplifier of claim 1, wherein said first edge control circuit comprises an inverter, said inverter coupled to a first supply voltage through a first variable impedance, said inverter coupled to a second supply voltage through a second variable impedance.

10. The high efficiency amplifier of claim 9, wherein said first variable impedance and said second variable impedance are adjustable to slow said transient portion and to reduce said overshoot and said undershoot in said high powered signal.

11. The high efficiency amplifier of claim 1, wherein said first edge control circuit is configured to adjust a slew rate of said high powered signal, thereby slowing said transient portion of said high powered signal and reducing said overshoot and said undershoot in said high powered signal.

12. The high efficiency amplifier of claim 1, wherein said high efficiency amplifier is incorporated into a class-D amplifier of a cellular telephone.

13. The high efficiency amplifier of claim 1, further comprising:
a second overlap protection circuit to produce a second tuning non-overlap in a second control signal for said output stage;
a second edge control circuit.

14. The high efficiency amplifier of claim 13, further comprising a control failsafe circuit configured to prevent said first control signal and said second control signal from concurrently providing an ON signal to said output stage.

15. The high efficiency amplifier of claim 14, wherein said control failsafe circuit comprises a NOR gate having an output coupled to an input of said first overlap protection circuit.

16. A method for substantially reducing an electromagnetic interference (EMI) in a high efficiency amplifier, said method comprising:
receiving a modulated signal;
producing a timing non-overlap in a control signal for an output stage of said high efficiency amplifier from an overlap protection circuit of said high efficiency amplifier, said overlap protection circuit comprising a variable degeneration impedance;
slowing a transient portion and reducing an overshoot and an undershoot of a high powered signal in said output stage, thereby substantially reducing said EMI.

17. The method of claim 16, wherein said producing said timing non-overlap substantially eliminates a crowbar current in said output stage.

18. The method of claim 16, wherein said producing said timing non-overlap comprises varying said variable degeneration impedance.

19. The method of claim 16, wherein said slowing said transient portion and said reducing said overshoot and said undershoot of said high powered signal comprises varying a degeneration impedance of an edge control circuit of said high efficiency amplifier.

20. The method of claim 16, wherein said slowing said transient portion and said reducing said overshoot and said undershoot of said high powered signal comprises adjusting a slew rate of said high powered signal.

* * * * *